(12) United States Patent
Tanaka et al.

(10) Patent No.: US 11,033,969 B2
(45) Date of Patent: Jun. 15, 2021

(54) CUTTING TOOL

(71) Applicant: SUMITOMO ELECTRIC HARDMETAL CORP., Itami (JP)

(72) Inventors: Keizo Tanaka, Itami (JP); Shinya Imamura, Itami (JP); Haruyo Fukui, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 16/636,521

(22) PCT Filed: Jun. 26, 2019

(86) PCT No.: PCT/JP2019/025274
§ 371 (c)(1),
(2) Date: Feb. 4, 2020

(87) PCT Pub. No.: WO2020/039735
PCT Pub. Date: Feb. 27, 2020

(65) Prior Publication Data
US 2021/0008634 A1    Jan. 14, 2021

(30) Foreign Application Priority Data
Aug. 24, 2018    (JP) .............................. JP2018-157418

(51) Int. Cl.
*B23B 27/14*    (2006.01)

(52) U.S. Cl.
CPC ........ *B23B 27/148* (2013.01); *B23B 2222/04* (2013.01); *B23B 2228/10* (2013.01)

(58) Field of Classification Search
CPC .... B23B 27/14; B23B 2222/04; B23B 228/10
(Continued)

(56) References Cited

U.S. PATENT DOCUMENTS 9,089,981 B2    7/2015  Senbokuya et al.
2007/0269610 A1  11/2007  Fukui et al.
(Continued)

FOREIGN PATENT DOCUMENTS

JP    2002-331408 A    11/2002
JP    2004-50381 A     2/2004
(Continued)

OTHER PUBLICATIONS

C. Tritremmel et al., "Mechanical and tribological properties of Al—Ti—N/Al—Cr—B—N multilayer films synthesized by cathodic arc evaporation," Surface & Coatings Technology, 246, (2014), pp. 57-63.

*Primary Examiner* — Archene A Turner
(74) *Attorney, Agent, or Firm* — Faegre Drinker Biddle & Reath LLP

(57) ABSTRACT

A cutting tool includes a substrate and a coating that coats a surface of the substrate, the coating including a multilayer structure layer composed of at least one layer A and at least one layer B alternately deposited from a side closer to the substrate toward a side closer to a surface, the layer A having an average composition of $Al_xCr_{(1-x)}N$, the layer B being composed of $Al_yTi_{(1-y)}N$, the layer A being composed of a domain region and a matrix region, the domain region having a composition ratio of Cr larger than that of Cr of the matrix region, wherein x has a range of $0.5 \leq x \leq 0.8$ and y has a range of $0.5 \leq y \leq 0.7$.

4 Claims, 7 Drawing Sheets

(58) Field of Classification Search
USPC .................................. 428/336, 697, 698, 699
See application file for complete search history.

(56) References Cited

U.S. PATENT DOCUMENTS

| | | | |
|---|---|---|---|
| 2009/0155559 A1* | 6/2009 | Xu | C23C 28/042 |
| | | | 428/216 |
| 2014/0193623 A1* | 7/2014 | Setoyama | B23C 5/16 |
| | | | 428/216 |
| 2018/0073124 A1 | 3/2018 | Nii et al. | |

FOREIGN PATENT DOCUMENTS

| | | | |
|---|---|---|---|
| JP | 2007-061993 | * | 3/2007 |
| JP | 2009-125832 | * | 6/2009 |
| JP | 2009-248238 A | | 10/2009 |
| JP | 2010-012564 | * | 1/2010 |
| JP | 2010-284787 | * | 12/2010 |
| JP | 2014-091169 | * | 5/2011 |
| JP | 2012-166333 A | | 9/2012 |
| JP | 2016-199793 A | | 12/2016 |
| JP | 2017-154200 A | | 9/2017 |
| WO | WO-2006/070730 A1 | | 7/2006 |

* cited by examiner

CUTTING TOOL

TECHNICAL FIELD

The present disclosure relates to a cutting tool. The present application claims priority based on Japanese Patent Application No. 2018-157418 filed on Aug. 24, 2018. The entire contents of the description of the Japanese patent application are incorporated herein by reference.

BACKGROUND ART

Conventionally, cutting tools made of cemented carbide or the like have been used to cut steel, castings, and the like. When such a cutting tool is used to cut a workpiece the cutting tool has its cutting edge exposed to a severe environment such as high temperature and high stress, which invites wearing and chipping of the cutting edge.

Therefore, it is important to suppress wearing and chipping of the cutting edge in order to improve the life of the cutting tool.

For the purpose of improving a cutting tool's cutting performance, a development of a coating for coating a surface of a substrate of cemented carbide or the like is underway. For example, International Publication No. 2006/070730 (Patent Literature 1) discloses a surface-coated cutting tool including a substrate and a coating layer formed on a surface of the substrate, the coating layer including alternate layers composed of at least one layer A and at least one layer B deposited one on the other alternately, the layer A being composed of a nitride of Al and Cr, the layer B being composed of a nitride of Ti and Al.

Japanese Patent Laid-Open No. 2002-331408 (Patent Literature 2) discloses a wear-resistant coated tool in which a substrate is coated with a hard coating formed of at least one hard layer having a chemical composition indicated by (TiSi)(NB), the hard layer being composed of a (TiSi)(NB) phase relatively rich in Si and a (TiSi)(NB) phase relatively less in Si, the (TiSi)(NB) phase relatively rich in Si being an amorphous phase.

Furthermore, C. Tritremmel et al., Surface & Coatings Technology, 246, (2014), 57-63 (Non-Patent Literature 1) discloses that an Al—Ti—N/Al—Cr—B—N multilayer film has been synthesized by cathodic arc evaporation.

CITATION LIST

Patent Literature

PTL 1: WO 2006/070730
PTL 2: Japanese Patent Laying-Open No. 2002-331408

Non Patent Literature

NPL 1: C. Tritremmel et al., "Mechanical and tribological properties of Al—Ti—N/Al—Cr—B—N multilayer films synthesized by cathodic arc evaporation," Surface & Coatings Technology, 246, (2014), 57-63

SUMMARY OF INVENTION

According to the present disclosure, a cutting tool comprises:

a substrate and a coating that coats a surface of the substrate, the coating including a multilayer structure layer composed of at least one layer A and at least one layer B alternately deposited from a side closer to the substrate toward a side closer to a surface, the layer A having an average composition of $Al_xCr_{(1-x)}N$, the layer B being composed of $Al_yTi_{(1-y)}N$, the layer A being composed of a domain region and a matrix region, the domain region being a region present as a plurality of portions dispersed in the matrix region, the matrix region being a region disposed to surround each of the plurality of portions constituting the domain region, the domain region having a composition ratio of Cr larger than that of Cr of the matrix region. Herein x has a range of $0.5 \leq x \leq 0.8$, and y has a range of $0.5 \leq y \leq 0.7$.

DETAILED DESCRIPTION

Figure 1A:
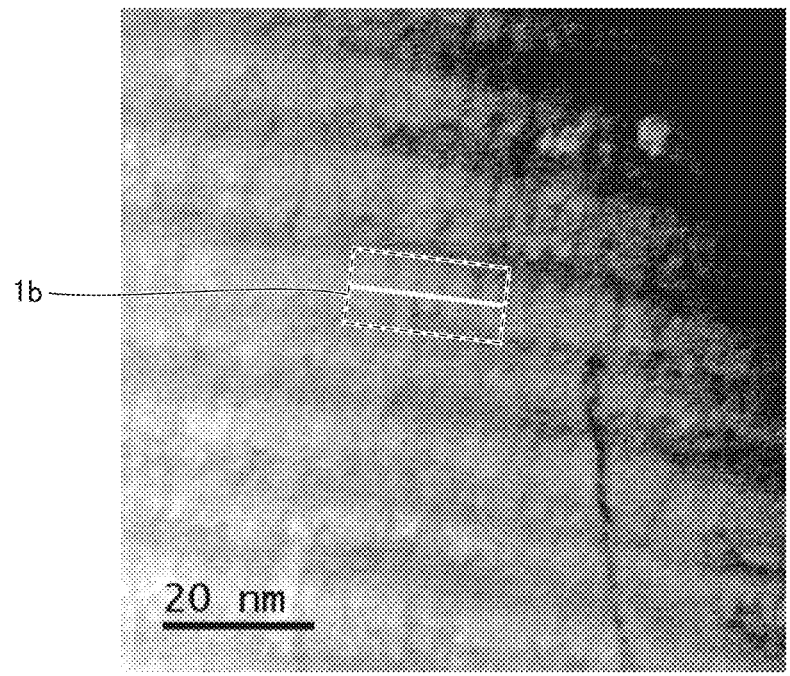
FIG. 1A is a photographic image of a cross section of a coating of a cutting tool according to an embodiment, as obtained through a scanning transmission electron microscope.

Problem to be Solved by the Present Disclosure

For example, the wear-resistant coated tool described in Patent Literature 2 has a low hardness because the coating includes an amorphous layer, and thus the cutting tool has room for improvement in performance. Moreover, as the wear-resistant coated tool includes a (TiSi)(NB) phase, it tends to allow residual stress to be high and thus has room for improvement in adhesion between the substrate and the coating.

Furthermore, in recent years, there is a demand for more efficient cutting (that is, cutting at a high feed rate), and further improvement in wear resistance is expected.

The present disclosure has been made in view of the above circumstances, and an object thereof is to provide a cutting tool having excellent wear resistance.

Advantageous Effect of the Present Disclosure

According to the above, a cutting tool having excellent wear resistance can be provided.

Description of Embodiments of the Present Disclosure

Initially, embodiments of the present disclosure will be enumerated and specifically described.

[1] According to the present disclosure, a cutting tool comprises:

a substrate and a coating that coats a surface of the substrate, the coating including a multilayer structure layer composed of at least one layer A and at least one layer B alternately deposited from a side closer to the substrate toward a side closer to a surface, the layer A having an average composition of $Al_xCr_{(1-x)}N$, the layer B being composed of $Al_yTi_{(1-y)}N$, the layer A being composed of a domain region and a matrix region, the domain region being a region present as a plurality of portions dispersed in the matrix region, the matrix region being a region disposed to surround each of the plurality of portions constituting the domain region, the domain region having a composition ratio of Cr larger than that of Cr of the matrix region. Herein x has a range of $0.5 \leq x \leq 0.8$, and y has a range of $0.5 \leq y \leq 0.7$.

By having the above-described configuration, the cutting tool can have excellent wear resistance.

[2] The layer A has a thickness of 0.2 nm or more and 3 µm or less. Such a definition enables suppression of development of cracking caused in the multilayer structure layer.

[3] The layer B has a thickness of 0.2 nm or more and 3 µm or less. Such a definition enables suppression of development of cracking caused in the multilayer structure layer.

[4] The multilayer structure layer has a thickness of 0.5 µm or more and 30 µm or less. Such a definition can provide excellent wear resistance and in addition excellent breaking resistance.

DETAILS OF EMBODIMENTS OF THE PRESENT DISCLOSURE

Hereinafter, an embodiment of the present disclosure (hereinafter also referred to as "the present embodiment") will be described. It should be noted, however, that the present embodiment is not exclusive. In the present specification, an expression in the form of "A-B" means a range's upper and lower limits (that is, A or more and B or less), and when A is not accompanied by any unit and B is alone accompanied by a unit, A has the same unit as B. Further, in the present specification, when a compound is represented by a composition formula with its constituent element composition ratio unspecified, such as "TiC," the composition formula shall encompass any conventionally known composition ratio (or element ratio). The chemical formula shall include not only a stoichiometric composition but also a nonstoichiometric composition. For example, the chemical formula of "TiC" includes not only a stoichiometric composition of "$Ti_1C_1$" but also a non-stoichiometric composition for example of "$Ti_1C_{0.8}$." This also applies to compounds other than "TiC."

<<Surface-Coated Cutting Tool>>

According to the present disclosure, a cutting tool comprises:

a substrate and a coating that coats a surface of the substrate, the coating including a multilayer structure layer composed of at least one layer A and at least one layer B alternately deposited from a side closer to the substrate toward a side closer to a surface, the layer A having an average composition of $Al_xCr_{(1-x)}N$, where $0.5 \leq x \leq 0.8$, the layer B being composed of $Al_yTi_{(1-y)}N$, where $0.5 \leq y \leq 0.7$, the layer A being composed of a domain region and a matrix region, the domain region being a region located in the matrix region and divided into a plurality of portions, and present in a dispersed state, the matrix region being a region disposed to surround each of the plurality of regions constituting the domain region, the domain region having a composition ratio of Cr larger than that of Cr of the matrix region.

The surface-coated cutting tool of the present embodiment (hereinafter also simply referred to as a "cutting tool") includes a substrate and a coating that coats the substrate. The cutting tool can for example be a drill, an end mill, an indexable cutting insert for a drill, an indexable cutting insert for an end mill, an indexable cutting insert for milling, an indexable cutting insert for turning, a metal saw, a gear cutting tool, a reamer, a tap, or the like.

Figure 4:
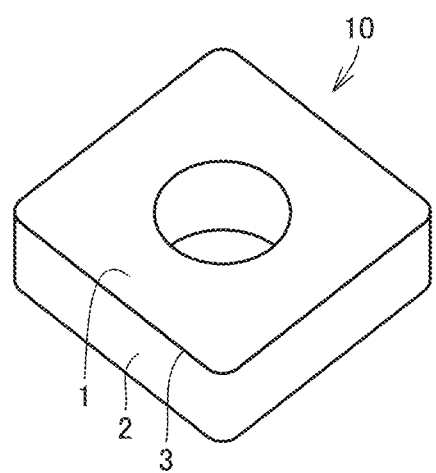
FIG. 4 is a perspective view for illustrating one aspect of the cutting tool.

FIG. 4 is a perspective view for illustrating one aspect of the cutting tool. A cutting tool 10 having such a shape is used as, for example, an indexable cutting insert for turning. Cutting tool 10 has a rake face 1, a flank face 2, and a cutting edge ridge portion 3 where rake face 1 and flank face 2 meet. That is, rake face 1 and flank face 2 are faces that are connected with cutting edge ridge portion 3 interposed therebetween. Cutting edge ridge portion 3 constitutes a tip of the cutting edge of cutting tool 10.

<Substrate>

The substrate of the present embodiment can be any substrate conventionally known as a substrate of this type. For example, it preferably includes at least one selected from the group consisting of a cemented carbide (for example, a tungsten carbide (WC)-based cemented carbide, a cemented carbide containing WC and, in addition, Co, a cemented carbide with a carbonitride of Cr, Ti, Ta, Nb, or the like other than WC added, or the like), a cermet (mainly composed of TiC, TiN, TiCN, or the like), a high-speed steel, ceramics (titanium carbide, silicon carbide, silicon nitride, aluminum nitride, aluminum oxide, and the like), a cubic crystal boron nitride sintered material (a cBN sintered material), and a diamond sintered material. More preferably, the substrate includes at least one selected from the group consisting of cemented carbide, cermet, and a cBN sintered material.

Of these various types of substrates, it is particularly preferable to select a WC-based cemented carbide or a cBN sintered material. This is because these substrates are particularly excellent in balance between hardness and strength at high temperature and have excellent characteristics as a substrate for a cutting tool for the above-described application.

When using a cemented carbide as a substrate, the effect of the present embodiment is exhibited even if the cemented carbide has a structure including free carbon or an extraordinary phase referred to as η phase. Note that the substrate used in the present embodiment may have its surface modified. For example, the cemented carbide may have its surface with β-free layer formed thereon, and the cBN sintered material may have a surface hardened layer, and even if the surface is modified in this way the effect of the present embodiment is exhibited.

When the cutting tool is an indexable cutting insert, the substrate also includes a substrate with or without a chip breaker. The cutting edge ridge portion is shaped to include any of a sharp edge (a ridge formed by a rake face and a flank face), a honed edge (a sharp edge processed to be rounded), a negative land (with beveling applied), and a combination of the honed edge and the negative land.

<Coating>

Figure 5:
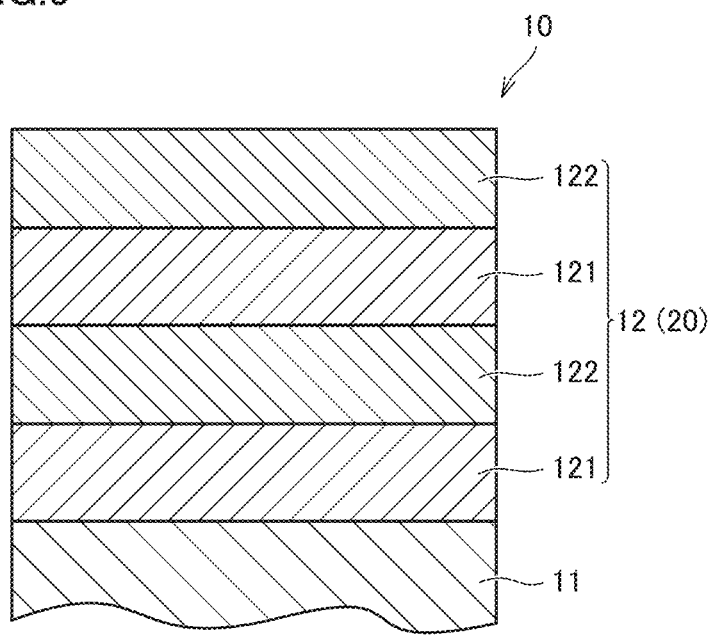
FIG. 5 is a schematic cross section of a cutting tool according to one aspect of the present embodiment.

A coating 20 according to the present embodiment includes a multilayer structure layer 12 composed of at least one layer A 121 and at least one layer B 122 alternately deposited from a side closer to substrate 1 toward a side closer to a surface (see FIG. 5 for example). The "coating" coats at least a part of the substrate (for example, a portion that comes into contact with a workpiece during cutting) to exhibit a function to improve the cutting tool's various characteristics such as breaking resistance, wear resistance, and the like. The coating preferably coats the entire surface of the substrate. However, even if the substrate is partially uncoated with the coating or the coating is partially different in configuration, such does not depart from the scope of the present embodiment.

The coating's thickness is preferably 0.5 µm or more and 30 µm or less, more preferably 1 µm or more and 10 µm or less. Note that the coating's thickness means a total in thickness of any layers constituting the coating. A "layer constituting the coating" includes a multilayer structure layer, an underlying layer, an outermost layer, and the like, as will be described hereinafter. For example, the thickness of the coating is measured by measuring any 10 points in a sample of the coating in a cross section parallel to the direction of a normal to a surface of the substrate with a scanning transmission electron microscope (STEM), and calculating an average value of the measured 10 points in thickness. The same applies when measuring in thickness a multilayer structure layer, an underlying layer, an outermost layer, and the like described hereinafter. The scanning transmission electron microscope is JEM-2100F (trade name) manufactured by JEOL Ltd., for example.

(Multilayer Structure Layer)

The multilayer structure layer according to the present embodiment includes a layer A and a layer B. The multilayer structure layer is composed of at least one layer A and at least one layer B alternately deposited from a side closer to the substrate toward a side closer to a surface. Herein, multilayer structure layer 12 on the side of substrate 11 preferably starts with layer A 121 (for example, see FIG. 5). This allows a layer B to be disposed on a layer A finely structured, and thus facilitates finely structuring the layer B.

The multilayer structure layer may be provided directly on the substrate or may be provided on the substrate via another layer such as an underlying layer insofar as the effect of the cutting tool according to the present embodiment is not impaired. The multilayer structure layer may be provided thereon with another layer such as an outermost layer. The multilayer structure layer may be an outermost layer (an outermost surface layer) of the coating.

When the multilayer structure layer has the layer A and the layer B as one repeating unit, the number of repeating units is preferably 2 to 10000, more preferably 2 to 3000. The number of repeating units can for example be calculated from the following equation:

(Number of repeating units)=(Thickness of multi-
layer structure layer)/(Total thickness of layers
A and B)

The thickness of the repeating unit (a total in thickness of the layer A and the layer B) is preferably 0.4 nm or more and 6 µm or less, more preferably 1 nm or more and 4 µm less, still more preferably 2 nm or more and 10 nm or less.

The thickness of the multilayer structure layer is preferably 0.5 µm or more and 30 µm or less, more preferably 1 µm or more and 20 µm or less, still more preferably 3 µm or more and 10 µm or less.

(Layer A)

Figure 6:
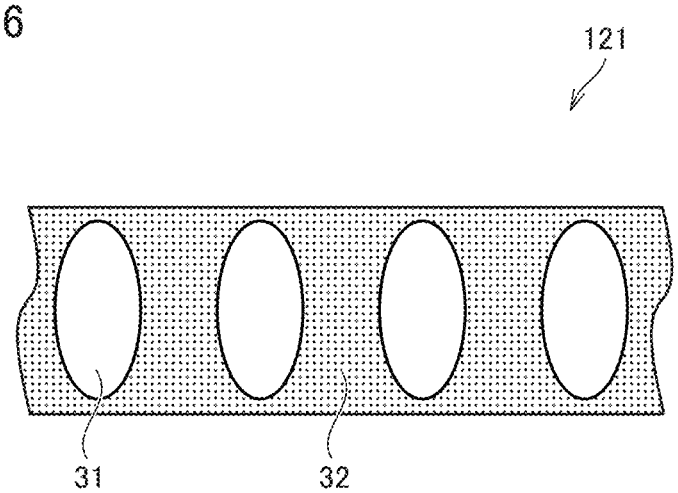
FIG. 6 is an enlarged schematic cross section of a layer A in an embodiment.

Layer A 121 according to the present embodiment includes a domain region 31 and a matrix region 32 (for example, see FIG. 6). That is, the layer A has a fine structure. Herein, a "domain region" means a region located in a matrix region, which will be described hereinafter, and divided into a plurality of portions, and present in a dispersed state. In other words, the domain region is present as a plurality of portions dispersed in the matrix region. The domain region can also be understood as a region present in the layer A and divided into a plurality of regions. Note that the "dispersed" state does not exclude domain regions which are in contact with each other. That is, each domain region may be in contact with each other or separated from each other.

The "matrix region" is a region serving as a matrix for the layer A and means a region other than the domain region. In other words, the matrix region is a region disposed to surround each of a plurality of regions (the plurality of portions) constituting the domain region. In another aspect of the present embodiment, the matrix region can also be understood to have a major portion disposed to surround each of a plurality of regions constituting the domain region. The matrix region can also be understood to have a major portion disposed between a plurality of regions constituting the domain region.

The domain region and the matrix region can each be identified for example through an analysis using LAADF-STEM: Low-Angle Annular Dark-Field Scanning Transmission Electron Microscopy. A cross-sectional STEM image obtained from the analysis using LAADF-STEM represents more brightly an atom having a large atomic number and a region having strain. Specifically, initially, the cutting tool is cut in the same manner as when measuring the thickness of the coating, and the cut surface is polished to prepare a cut piece of a length of 2.5 mm×a width of 0.5 mm×a thickness of 0.1 mm including the substrate and the coating. A measurement sample is obtained by processing the cut piece using an ion slicer device (trade name: "IB-09060CIS," manufactured by JEOL Ltd.) until the cut piece has a thickness of 50 nm or less. Further, a cross-sectional STEM image as shown in FIG. 1A is obtained by analyzing the measurement sample by using LAADF-STEM. This is done with a measurement magnification for example of 2 million times. In a region 1b shown in FIG. 1A, it can be visually confirmed that a dark region (or the matrix region) is disposed to surround each of bright regions (or the domain region). In the present embodiment, for analysis using LAADF-STEM, for example, a STEM device (trade name: "JEM-2100F," manufactured by JEOL Ltd.) can be used with an acceleration voltage of 200 kV. The STEM device is equipped with a spherical aberration correction device (CE-SCOR, manufactured by CEOS GmbH).

Figure 1B:
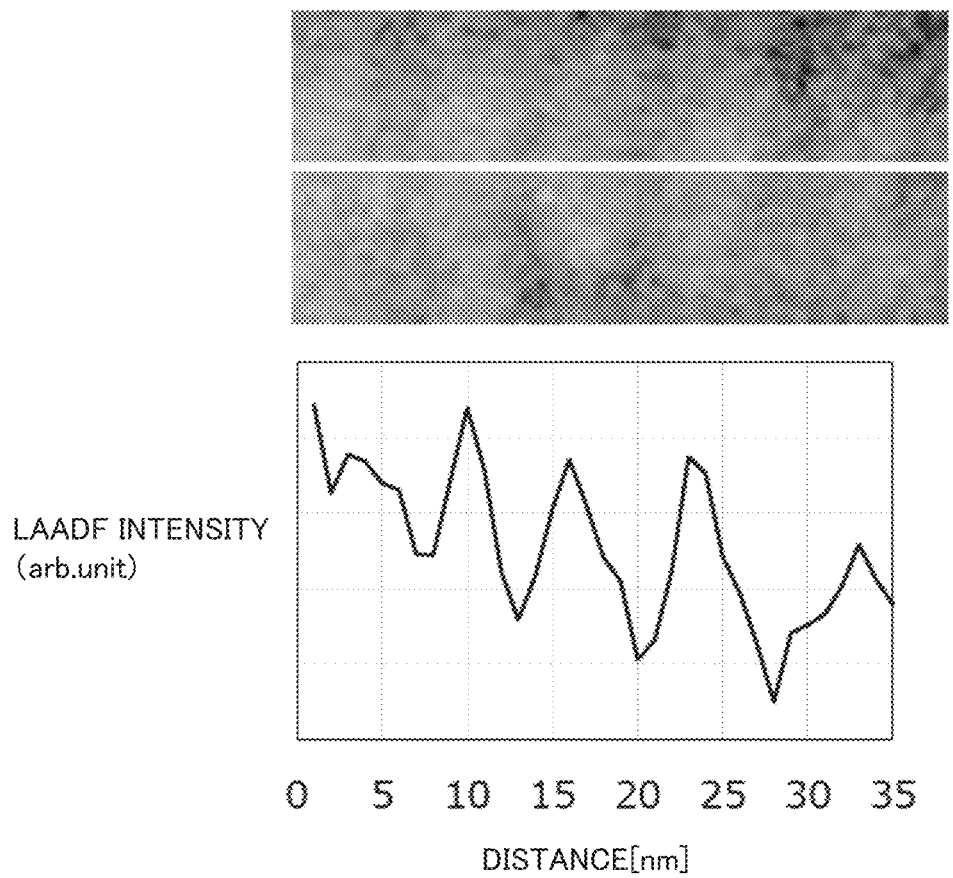
FIG. 1B is a graph representing a result of a line analysis of a region 1b in FIG. 1A by an analysis method using the LAADF-STEM method.

Subsequently, as shown in the photograph on the upper side in FIG. 1B, in a region corresponding to the layer A in the cross-sectional STEM image (i.e., region 1b in FIG. 1A), brightness attributed to the layer A's atoms and strain and the like, as observed for a width of 2 nm along the layer A in a direction parallel to an interface between the layer A and the layer B, is measured as a LAADF intensity profile. On the lower side of FIG. 1B is shown a result of the intensity profile obtained by this measurement. In FIG. 1B, the intensity profile is represented as a line graph with the X axis (the horizontal axis) representing a distance from a measurement starting point on the layer A and the Y axis (the vertical axis) representing intensity (or brightness attributed to atoms).

As shown in the line graph of FIG. 1B, when the cutting tool according to the present embodiment presents a repeated pattern of irregularities in the intensity profile, it is determined that it has a domain region and a matrix region. It can be determined that a peak portion of the LAADF intensity represents a domain region, and a valley portion of the LAADF intensity represents a matrix region. Furthermore, the domain region and the matrix region can be determined more clearly by matching the above-described cross-sectional STEM image (for example, region 1b in FIG. 1A) against the repeated pattern of irregularities in the intensity profile.

The layer A has an average composition of $Al_xCr_{(1-x)}N$, where $0.5 \leq x \leq 0.8$. Herein, the average composition of the layer A means a composition throughout layer A without distinguishing between the domain region and the matrix region. The average composition of the layer A can be calculated for example as follows: A center part of each layer A is subjected to a line analysis by TEM-EELS (with an observation magnification of 2 million times) to calculate a composition ratio of Al and Cr.

In $Al_xCr_{(1-x)}N$, x is 0.5 or more and 0.8 or less, preferably 0.6 or more and 0.7 or less. That is, x has a range of $0.5 \leq x \leq 0.8$, preferably $0.6 \leq x \leq 0.7$.

The domain region has a composition ratio of Cr larger than that of Cr of the matrix region. This can provide excellent wear resistance and in addition excellent breaking resistance. The composition ratio of Cr can be determined by, for example, an analysis through electron energy loss spectroscopy (EELS) using a scanning transmission electron microscope. Specifically, initially, a measurement sample is prepared in the same method as used to prepare the measurement sample used for the LAADF-STEM. Further, such a cross-sectional STEM image as shown in FIG. 1A is obtained by analyzing the measurement sample by using a STEM. In the present embodiment, for analysis using a STEM, for example, a STEM device (trade name: "JEM-2100F," manufactured by JEOL Ltd.) can be used with an acceleration voltage of 200 kV. In the STEM image obtained by the measurement, an intensity profile corresponding to Cr along the layer A in a direction parallel to an interface between the layer A and the layer B is measured in the EELS method. In that case, in the Cr intensity profile, a high region can be determined as a domain region, and a relatively low region can be determined as a matrix region (for example, see FIG. 1C).

Figure 3A:
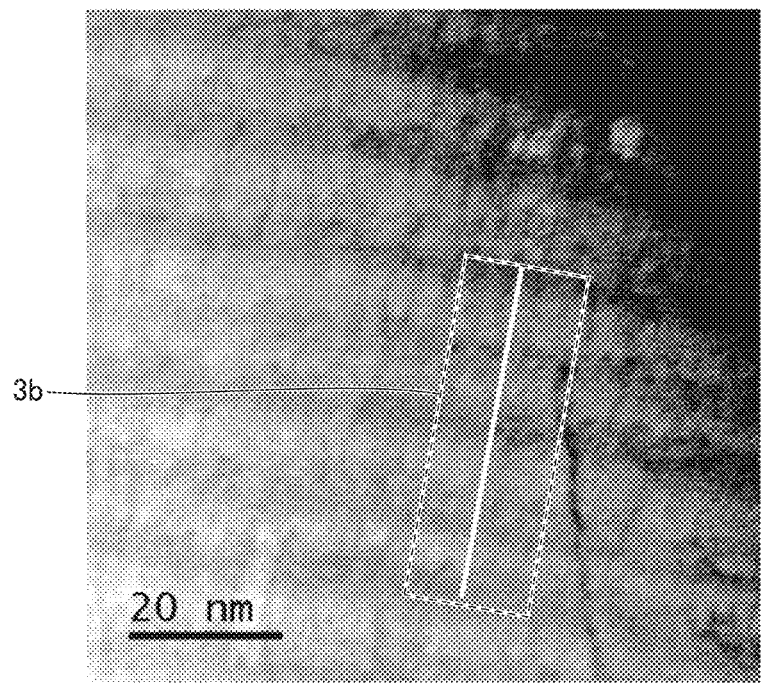
FIG. 3A is a photographic image of a cross section of a coating of a cutting tool according to an embodiment, as obtained through a scanning transmission electron microscope.
Figure 3B:
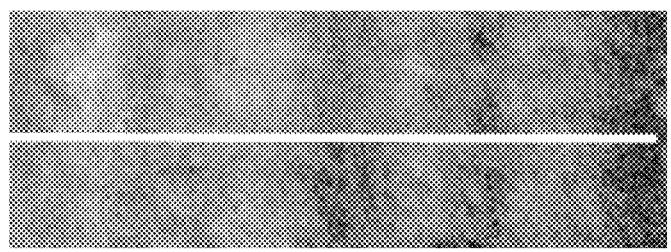
FIG. 3B is a graph representing a result of a line analysis of a region 3b in FIG. 3A by the EELS method.
Figure 3B:
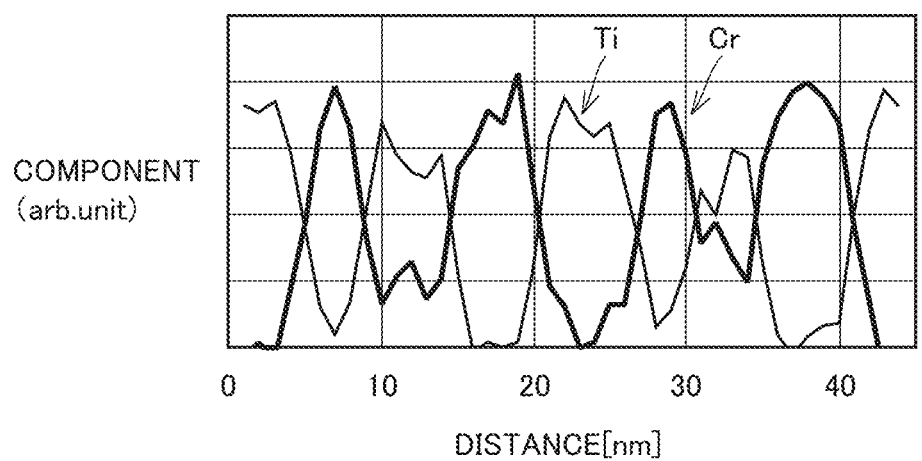

The layer A preferably has a thickness of 0.2 nm or more and 3 μm or less, more preferably 0.5 nm or more and 2 μm or less, still more preferably 1 nm or more and 0.1 μm or less. The thickness of the layer A can be determined by an analysis using EELS as described above. More specifically, in the STEM image obtained by the measurement, intensity profiles corresponding to Cr and Ti are measured in a direction parallel to a direction in which the multilayer structure layer is stacked (a region 3b in FIG. 3A). On the lower side of FIG. 3B is shown a result of the intensity profiles obtained by this measurement. In FIG. 3B, an intensity profile is represented as a line graph with the X axis (the horizontal axis) representing a distance from a measurement starting point on the multilayer structure layer and the Y axis (the vertical axis) representing intensity (or brightness attributed to atoms). In the obtained graph, a distance along the X axis between intersections of a line graph corresponding to Cr and a line graph corresponding to Ti is defined as a thickness of each layer. In the present embodiment, Cr exists only in the layer A, and accordingly, a distance along the X axis between such intersections which are located at a portion having a composition ratio of Cr higher than a composition ratio of Ti corresponds to a thickness of the layer A. The thickness of each layer A thus determined is calculated at at least four locations, and an average value thereof is taken as the thickness of the layer A.

The layer A may have droplets containing boron. As will be described hereinafter, the method for manufacturing a cutting tool according to the present embodiment includes a trace amount of boron (B) as a source material for the layer A in order to form the domain region and the matrix region. Thus, droplets containing boron can be formed in the layer A. Since the droplets are derived from a source material for the layer A, they can contain Al and Cr in addition to boron. An analysis of the droplets in the layer A can be performed, for example, by the following method: Initially, the cutting tool is cut, and the cut surface is polished using a focused ion beam device, a cross section polisher device, or the like. Subsequently, the polished, cut surface is subjected to a composition analysis with an EDX which a scanning electron microscope is equipped with.

(Layer B)

The layer B according to the present embodiment is composed of $Al_yTi_{(1-y)}N$, where $0.5 \leq y \leq 0.7$. The composition of $Al_yTi_{(1-y)}N$ in the layer B can be determined in a method similar to that employed in determining the average composition of the layer A as described above.

In $Al_yTi_{(1-y)}N$, y is 0.5 or more and 0.7 or less, preferably 0.55 or more and 0.65 or less. That is, y has a range of $0.5 \leq y \leq 0.7$, preferably $0.55 \leq y \leq 0.65$.

In the present embodiment, the layer B preferably has a fine structure. The fine structure may be a particulate structure (a structure including only a domain region) or a so-called sea-island structure (a structure including a domain region and a matrix region). Whether the layer B has the fine structure can be determined, for example, by observing a STEM image obtained in a method similar to the method described above. Note that when the B layer has the sea-island structure, the composition of $Al_yTi_{(1-y)}N$ in the B layer means an average composition throughout the B layer.

The layer B preferably has a thickness of 0.2 nm or more and 3 μm or less, more preferably 0.5 nm or more and 2 μm or less, still more preferably 1 nm or more and 0.1 μm or less. The thickness of the layer B can be determined, as well as that of the layer A, by an analysis using EELS as described above. Herein, Ti exists only in the layer B, and accordingly, a distance along the X axis between such intersections which are located at a portion having a composition ratio of Ti higher than a composition ratio of Cr will correspond to a thickness of the layer B. The thickness of each layer B thus determined is calculated at at least four locations, and an average value thereof is taken as the thickness of the layer B.

(Another Layer)

Within a range which does not impair the effect of the present embodiment, the coating may further include another layer. The other layer may have a composition different from or identical to that of the multilayer structure layer. For example, the other layer can be a TiN layer, a TiCN layer, a TiBN layer, an $Al_2O_3$ layer, and the like for example. Note that the layer may be deposited in any order. For example, the other layer includes an underlying layer provided between the substrate and the multilayer structure layer, and an outermost layer provided on the multilayer structure layer, and the like by way of example. While the thickness of the other layer is not particularly limited as long as the effect of the present embodiment is not impaired, it is for example 0.1 μm or more and 2 μm or less.

<<Method for Manufacturing Surface-Coated Cutting Tool>>

A method for manufacturing a cutting tool according to the present embodiment includes:

preparing the substrate (hereinafter also referred to as a "first step"); and forming the multilayer structure layer by depositing at least one layer A and at least one layer B alternately on the substrate through physical vapor deposition (hereinafter also referred to as a "second step").

Physical vapor deposition is a type of vapor deposition in which a source material (also referred to as an "evaporation source" or a "target") is evaporated through a physical action, and the evaporated source material is deposited on a substrate or the like. In particular, the physical vapor deposition used in the present embodiment is preferably at least one selected from the group consisting of cathodic arc ion plating, balanced magnetron sputtering, and unbalanced magnetron sputtering. Of these, cathodic arc ion plating is more preferable as it allows an element serving as a source material to be ionized at a high ratio. When cathodic arc ion plating is used, then, before the coating is formed, the substrate can have a surface subjected to a cleaning metal ion bombardment treatment, and a reduced cleaning time can be achieved.

In cathodic arc ion plating, the substrate is set in an apparatus and a target is set as a cathode, and a high current is applied to the target to cause arc discharge. This evaporates and thus ionizes atoms constituting the target, and a negative bias voltage is applied to the substrate to deposit them on the substrate to form a coating.

In balanced magnetron sputtering, the substrate is placed in an apparatus and a target is placed on a magnetron electrode having a magnet to form a balanced magnetic field, and high-frequency power is applied between the magnetron electrode and the substrate to generate a gas plasma. The gas plasma generates ion of gas, which is caused to impinge on the target and atoms thereby emitted from the target are ionized and deposited on the substrate to form a coating.

In unbalanced magnetron sputtering, a coating is formed by making unbalanced the magnetic field generated by the magnetron electrode in balanced magnetron sputtering described above.

<First Step: Step of Preparing a Substrate>

In the first step, a substrate is prepared. For example, as the substrate, a cemented carbide substrate is prepared. The cemented carbide substrate may be a commercially available substrate or may be produced through typical powder metallurgy. When it is manufactured through typical powder metallurgy, for example, a ball mill or the like is used to mix powdery WC and powdery Co together to obtain a powdery mixture. After the powdery mixture is dried, it is shaped as predetermined to obtain a shaped body. Furthermore, the shaped body is sintered to obtain a WC-Co-based cemented carbide (a sintered material). Subsequently, the sintered material can be honed or similarly processed, as predetermined, for a cutting edge to manufacture a substrate made of a WC-Co-based cemented carbide. In the first step, any substrate other than the above-described substrate can be prepared as long as it is a substrate conventionally known as a substrate of this type.

<Second Step: Step of Forming a Multilayer Structure Layer>

In the second step, a multilayer structure layer is composed of at least one layer A and at least one layer B alternately deposited. This is done in a variety of types of methods depending on the composition of the layers A and B to be formed. For example, the method can be a method using an alloy target with Ti, Cr, Al, boron and the like varying in particle diameter, a method using a plurality of targets different in composition, a method with a pulsed voltage applied as a bias voltage applied when providing deposition, a method in which deposition is done with a varying gas flow rate, a method in which a substrate holder that holds the substrate in a deposition apparatus is rotated at an adjusted speed, or the like. The multilayer structure layer can also be formed by combining these methods.

For example, the second step can be performed as follows: Initially, a chip having a shape as desired is attached as a substrate in a chamber of a deposition apparatus. For example, the substrate is attached to an external surface of the substrate holder on a rotary table that is rotatably provided at the center in the chamber of the deposition apparatus. A bias power supply is attached to the substrate holder. Nitrogen is introduced as a reactive gas while the substrate is rotated at the center of the chamber. Further, while the substrate's temperature is maintained at 400 to 700° C., the reactive gas's pressure is maintained at 1.0 to 5.0 Pa, and the bias power supply's voltage is maintained within a range of −30 to −800 V, or they are each changed gradually, an arc current of 100 to 200 A is supplied to each of an evaporation source for forming the layer A and that for forming the layer B. This generates metal ions from each of the evaporation source for forming the layer A and that for forming the layer B and once a predetermined period of time has elapsed, supplying the arc current is stopped, and the multilayer structure layer is formed on a surface of the substrate. In doing so, the multilayer structure layer is produced by depositing the layers A and B having the above-described compositions, one on the other alternately, while rotating the substrate at a rate controlled to allow the layers to each have a predetermined thickness. Furthermore, the deposition time is adjusted to allow the multilayer structure layer to have a thickness adjusted to fall within a predetermined range.

In doing so, an element derived from the evaporation source for the layer A is initially deposited on the substrate to form a fine structure (a domain region and a matrix region) for the layer A. Thereafter, as an element derived from the evaporation source for the layer B is deposited on the layer A, the present inventors consider that the layer B is also finely structured by being induced by the fine structure of the layer A. In some manufacturing methods, an element derived from the evaporation source for the layer B is initially deposited on the substrate. However, the above fine structuring does not occur, and it can be understood that not the layer B but an underlying layer having a composition similar to that of the layer B is formed on the substrate.

In the second step, a source material for the layer A contains Al, Cr, and boron. Conventionally, boron (for example, 10 at % or more) has been added to the source material in order to improve the coating in slidability (see NPL 1). The present embodiment differs from conventional art in that a trace amount of boron (for example, less than 10 at %) is added as a source material for the layer A in order to form the domain region and the matrix region in the layer A. The present inventors consider that when a source material for the layer A that includes boron in addition to Al and Cr, then, in a process of deposition on the substrate through PVD, Al and Cr are separated, and a domain region rich in Cr and a matrix region rich in Al are formed.

When the layer A's entire source material is represented as one, the boron's content (in atomic ratio) is preferably 0.01 or more and less than 0.1, more preferably 0.03 or more and 0.07 or less, still more preferably 0.03 or more and 0.05 or less. Such a boron content allows the domain region and the matrix region to be efficiently formed. In addition, it also allows the layer A to have high hardness.

While boron is normally considered as a semimetal that exhibits an intermediate property between a metallic element and a nonmetallic element, in the present embodiment, an element having free electron is regarded as metal, and boron shall be included in the range of metallic elements.

When the layer A's entire source material is represented as one, the Al's content (in atomic ratio) is preferably 0.5 to 0.8, more preferably 0.55 to 0.75.

When the layer A's entire source material is represented as one, the Cr's content (in atomic ratio) is preferably 0.2 to 0.5, more preferably 0.2 to 0.4.

In the second step, a source material for the layer B includes Al and Ti. When the layer B's entire source material is represented as one, the Al's content (in atomic ratio) is preferably 0.5 to 0.7, more preferably 0.55 to 0.7.

When the layer B's entire source material is represented as one, the Ti's content (in atomic ratio) is preferably 0.3 to 0.5, more preferably 0.3 to 0.45.

After the multilayer structure layer is formed, compressive residual stress may be imparted to the coating. This is because doing so enhances toughness. Compressive residual stress can be imparted by, for example, blasting, brushing, a barrel processing, ion injection, or the like.

<Other Steps>

In the manufacturing method according to the present embodiment, in addition to the steps described above, the step of forming an underlying layer between the substrate and the multilayer structure layer, the step of forming an outermost layer on the multilayer structure layer, the step of surface treatment, and the like may be performed as appropriate. When another layer such as the underlying and outermost layers is formed, the other layer may be formed in a conventional method. Specifically, for example, the other layer may be formed through PVD as has been described above. The step of surface treatment includes a surface treatment using a medium with a stress imparting elastic material carrying powdery diamond, for example. An apparatus for performing the surface treatment is Sirius Z manufactured by Fuji Manufacturing Co., Ltd., for example.

The above description includes features appended below.

APPENDED NOTE 1

A surface-coated cutting tool comprising a substrate and a coating that coats a surface of the substrate, the coating including a multilayer structure layer composed of at least one layer A and at least one layer B alternately deposited from a side closer to the substrate toward a side closer to a surface, the layer A having an average composition of $Al_xCr_{(1-x)}N$, where $0.5 \leq x \leq 0.8$, the layer B being composed of $Al_yTi_{(1-y)}N$, where $0.5 \leq y \leq 0.7$, the layer A being composed of a domain region and a matrix region, the domain region being a region located in the matrix region and divided into a plurality of portions, and present in a dispersed state, the matrix region being a region disposed to surround each of the plurality of regions constituting the domain region, the domain region having a composition ratio of Cr larger than that of Cr of the matrix region.

APPENDED NOTE 2

The surface-coated cutting tool according to appended note 1, wherein the layer A has a thickness of 0.2 nm or more and 3 μm or less.

APPENDED NOTE 3

The surface-coated cutting tool according to appended note 1 or 2, wherein the layer B has a thickness of 0.2 nm or more and 3 μm or less.

APPENDED NOTE 4

The surface-coated cutting tool according to any one of appended notes 1 to 3, wherein the multilayer structure layer has a thickness of 0.5 μm or more and 30 μm or less.

EXAMPLE

Hereinafter, the present invention will more specifically be described with reference to examples although the present invention is not limited thereto.

<<Fabricating Surface-Coated Cutting Tool>>
<Preparing the Substrate>

Initially, a milling cemented carbide insert (SEMT13T3AGSN-G, a cemented carbide alloy equivalent to P30 according to the JIS standards) having a surface to be coated was prepared as a substrate on which a coating is to be formed (the step of preparing a substrate).

<Forming the Coating>

On a surface of the substrate, a coating was formed by forming a multilayer structure layer including layers A and B indicated in Tables 1 to 3. Hereinafter, a method for forming the multilayer structure layer will be described.

(Forming the Multilayer Structure Layer)

In Examples 1 to 21 and Comparative Examples 1 to 9, nitrogen was introduced as a reactive gas while the substrate was rotated at the center of the chamber. Further, while the substrate's temperature was maintained at 500° C., the reactive gas's pressure was maintained at 2.0 Pa, and the bias power supply's voltage was maintained at a fixed value within a range of −30 V to −800 V, or they were each changed gradually, an arc current of 100 A was supplied to each of an evaporation source for forming the layer A and that for forming the layer B. This generated metal ions from each of the evaporation source for forming the layer A and that for forming the layer B and once a predetermined period of time had elapsed, supplying the arc current was stopped, and multilayer structure layers having compositions shown in FIG. 1 were each formed on a surface of the substrate. Herein, as the evaporation source for forming the layer A and the evaporation source for forming the layer B were of the source material compositions indicated in Tables 1 to 3. The multilayer structure layers were produced by depositing layers A and B that have the compositions indicated in Tables 1 to 3, one on the other alternately, while rotating the substrate at a rate adjusted to allow the layers to have values in thickness indicated in Table 1.

For Comparative Example 1, a TiN layer was produced as a layer corresponding to the layer B. For Comparative Examples 1 to 7, the evaporation source for forming the layer A did not contain boron.

Through the above steps, cutting tools of Examples 1 to 21 and Comparative Examples 1 to 9 were produced.

TABLE 1

| examples | layer A source material composition | layer A's average composition | layer A's thickness | layer A's fine structure | layer B source material composition | layer B's composition | layer B's thickness | No. of repeating units of layer A + layer B | multilayer structure layer's thickness |
|---|---|---|---|---|---|---|---|---|---|
| 1 | $Al_{0.55}Cr_{0.40}B_{0.05}$ | $Al_{0.56}Cr_{0.44}N$ | 0.3 nm | D-M structure* | $Al_{0.55}Ti_{0.45}$ | $Al_{0.53}Ti_{0.47}N$ | 0.2 nm | 1000 | 0.5 μm |
| 2 | $Al_{0.55}Cr_{0.40}B_{0.05}$ | $Al_{0.56}Cr_{0.44}N$ | 3 μm | D-M structure | $Al_{0.55}Ti_{0.45}$ | $Al_{0.53}Ti_{0.47}N$ | 2.5 μm | 4 | 24 μm |
| 3 | $Al_{0.55}Cr_{0.40}B_{0.05}$ | $Al_{0.56}Cr_{0.44}N$ | 0.3 nm | D-M structure | $Al_{0.55}Ti_{0.45}$ | $Al_{0.53}Ti_{0.47}N$ | 0.2 nm | 2000 | 1 μm |
| 4 | $Al_{0.55}Cr_{0.40}B_{0.05}$ | $Al_{0.56}Cr_{0.44}N$ | 3 μm | D-M structure | $Al_{0.55}Ti_{0.45}$ | $Al_{0.53}Ti_{0.47}N$ | 2.5 μm | 2 | 11 μm |
| 5 | $Al_{0.63}Cr_{0.32}B_{0.05}$ | $Al_{0.64}Cr_{0.36}N$ | 5 nm | D-M structure | $Al_{0.55}Ti_{0.45}$ | $Al_{0.53}Ti_{0.47}N$ | 4 nm | 556 | 5 μm |
| 6 | $Al_{0.63}Cr_{0.32}B_{0.05}$ | $Al_{0.64}Cr_{0.36}N$ | 5 nm | D-M structure | $Al_{0.60}Ti_{0.40}$ | $Al_{0.58}Ti_{0.42}N$ | 4 nm | 556 | 5 μm |
| 7 | $Al_{0.63}Cr_{0.32}B_{0.05}$ | $Al_{0.64}Cr_{0.36}N$ | 5 nm | D-M structure | $Al_{0.65}Ti_{0.35}$ | $Al_{0.63}Ti_{0.37}N$ | 4 nm | 556 | 5 μm |
| 8 | $Al_{0.63}Cr_{0.32}B_{0.05}$ | $Al_{0.64}Cr_{0.36}N$ | 5 nm | D-M structure | $Al_{0.70}Ti_{0.30}$ | $Al_{0.68}Ti_{0.32}N$ | 4 nm | 556 | 5 μm |
| 9 | $Al_{0.55}Cr_{0.40}B_{0.05}$ | $Al_{0.56}Cr_{0.44}N$ | 5 nm | D-M structure | $Al_{0.65}Ti_{0.35}$ | $Al_{0.63}Ti_{0.37}N$ | 4 nm | 556 | 5 μm |
| 10 | $Al_{0.61}Cr_{0.32}B_{0.07}$ | $Al_{0.63}Cr_{0.37}N$ | 5 nm | D-M structure | $Al_{0.65}Ti_{0.35}$ | $Al_{0.63}Ti_{0.37}N$ | 4 nm | 556 | 5 μm |

*domain-matrix structure

TABLE 2

| examples | layer A source material composition | layer A's average composition | layer A's thickness | layer A's fine structure | layer B source material composition | layer B's composition | layer B's thickness | No. of repeating units of layer A + layer B | multilayer structure layer's thickness |
|---|---|---|---|---|---|---|---|---|---|
| 11 | $Al_{0.65}Cr_{0.32}B_{0.03}$ | $Al_{0.66}Cr_{0.34}N$ | 5 nm | D-M structure* | $Al_{0.65}Ti_{0.35}$ | $Al_{0.63}Ti_{0.37}N$ | 4 nm | 556 | 5 μm |
| 12 | $Al_{0.75}Cr_{0.20}B_{0.05}$ | $Al_{0.76}Cr_{0.24}N$ | 5 nm | D-M structure | $Al_{0.65}Ti_{0.35}$ | $Al_{0.63}Ti_{0.37}N$ | 4 nm | 556 | 5 μm |
| 13 | $Al_{0.63}Cr_{0.32}B_{0.05}$ | $Al_{0.64}Cr_{0.36}N$ | 1.8 μm | D-M structure | $Al_{0.65}Ti_{0.35}$ | $Al_{0.63}Ti_{0.37}N$ | 1.4 μm | 2 | 5 μm |
| 14 | $Al_{0.63}Cr_{0.32}B_{0.05}$ | $Al_{0.64}Cr_{0.36}N$ | 100 nm | D-M structure | $Al_{0.65}Ti_{0.35}$ | $Al_{0.63}Ti_{0.37}N$ | 80 nm | 28 | 5 μm |
| 15 | $Al_{0.63}Cr_{0.32}B_{0.05}$ | $Al_{0.64}Cr_{0.36}N$ | 20 nm | D-M structure | $Al_{0.65}Ti_{0.35}$ | $Al_{0.63}Ti_{0.37}N$ | 15 nm | 143 | 5 μm |
| 16 | $Al_{0.63}Cr_{0.32}B_{0.05}$ | $Al_{0.64}Cr_{0.36}N$ | 3 nm | D-M structure | $Al_{0.65}Ti_{0.35}$ | $Al_{0.63}Ti_{0.37}N$ | 2.4 nm | 926 | 5 μm |
| 17 | $Al_{0.63}Cr_{0.32}B_{0.05}$ | $Al_{0.64}Cr_{0.36}N$ | 1 nm | D-M structure | $Al_{0.65}Ti_{0.35}$ | $Al_{0.63}Ti_{0.37}N$ | 0.8 nm | 2778 | 5 μm |
| 18 | $Al_{0.63}Cr_{0.32}B_{0.05}$ | $Al_{0.64}Cr_{0.36}N$ | 5 nm | D-M structure | $Al_{0.65}Ti_{0.35}$ | $Al_{0.63}Ti_{0.37}N$ | 4 nm | 2000 | 18 μm |
| 19 | $Al_{0.63}Cr_{0.32}B_{0.05}$ | $Al_{0.64}Cr_{0.36}N$ | 5 nm | D-M structure | $Al_{0.65}Ti_{0.35}$ | $Al_{0.63}Ti_{0.37}N$ | 4 nm | 1111 | 10 μm |
| 20 | $Al_{0.63}Cr_{0.32}B_{0.05}$ | $Al_{0.64}Cr_{0.36}N$ | 5 nm | D-M structure | $Al_{0.65}Ti_{0.35}$ | $Al_{0.63}Ti_{0.37}N$ | 4 nm | 333 | 3 μm |
| 21 | $Al_{0.63}Cr_{0.32}B_{0.05}$ | $Al_{0.64}Cr_{0.36}N$ | 5 nm | D-M structure | $Al_{0.65}Ti_{0.35}$ | $Al_{0.63}Ti_{0.37}N$ | 4 nm | 111 | 1 μm |

*domain-matrix structure

TABLE 3

| comparative examples | layer A's source material composition | layer A's average composition | layer A's thickness | layer A's fine structure | layer B source material composition | layer B's composition | layer B's thickness | No. of repeating units of layer A + layer B | multilayer structure layer's thickness |
|---|---|---|---|---|---|---|---|---|---|
| 1 | $Al_{0.50}Cr_{0.50}$ | $Al_{0.48}Cr_{0.52}N$ | 5 nm | non-D-M structure* | Ti | TiN | 4 nm | 556 | 5 μm |
| 2 | $Al_{0.50}Cr_{0.50}$ | $Al_{0.48}Cr_{0.52}N$ | 5 nm | non-D-M structure | $Al_{0.50}Ti_{0.50}$ | $Al_{0.48}Ti_{0.52}N$ | 4 nm | 556 | 5 μm |
| 3 | $Al_{0.60}Cr_{0.40}$ | $Al_{0.58}Cr_{0.42}N$ | 5 nm | non-D-M structure | $Al_{0.55}Ti_{0.45}$ | $Al_{0.53}Ti_{0.47}N$ | 4 nm | 556 | 5 μm |
| 4 | $Al_{0.65}Cr_{0.35}$ | $Al_{0.63}Cr_{0.37}N$ | 5 nm | non-D-M structure | $Al_{0.55}Ti_{0.45}$ | $Al_{0.53}Ti_{0.47}N$ | 4 nm | 556 | 5 μm |
| 5 | $Al_{0.66}Cr_{0.34}$ | $Al_{0.64}Cr_{0.36}N$ | 5 nm | non-D-M structure | $Al_{0.55}Ti_{0.45}$ | $Al_{0.53}Ti_{0.47}N$ | 4 nm | 556 | 5 μm |
| 6 | $Al_{0.70}Cr_{0.30}$ | $Al_{0.68}Cr_{0.32}N$ | 5 nm | non-D-M structure | $Al_{0.55}Ti_{0.45}$ | $Al_{0.53}Ti_{0.47}N$ | 4 nm | 556 | 5 μm |
| 7 | $Al_{0.80}Cr_{0.20}$ | $Al_{0.79}Cr_{0.21}N$ | 5 nm | non-D-M structure | $Al_{0.55}Ti_{0.45}$ | $Al_{0.53}Ti_{0.47}N$ | 4 nm | 556 | 5 μm |
| 8 | $Al_{0.55}Cr_{0.40}B_{0.05}$ | $Al_{0.56}Cr_{0.44}N$ | 3 μm | D-M structure** | $Al_{0.40}Ti_{0.60}$ | $Al_{0.38}Ti_{0.62}N$ | 4 nm | 2 | 5 μm |
| 9 | $Al_{0.55}Cr_{0.40}B_{0.05}$ | $Al_{0.6}Cr_{0.44}N$ | 3 μm | D-M structure | $Al_{0.75}Ti_{0.25}$ | $Al_{0.73}Ti_{0.27}N$ | 4 nm | 2 | 5 μm |

*non-domain-matrix structure;
**domain-matrix structure

<<Evaluating Characteristics of Cutting Tools>>

By using the cutting tools of the samples (Examples 1 to 21 and Comparative Examples 1 to 9) produced as described above, a variety of characteristics of the cutting tools were evaluated as follows:

<Measuring the Coating (Or Multilayer Structure Layer) in Thickness>

The thickness of the coating (or multilayer structure layer) was measured by measuring any 10 points in a sample of the coating in a cross section parallel to the direction of a normal to a surface of the substrate with a scanning transmission electron microscope (STEM) (manufactured by JEOL Ltd., trade name: JEM-2100F), and calculating an average value of the measured 10 points in thickness. A result thereof is shown in table 1 to table 3.

Figure 2:
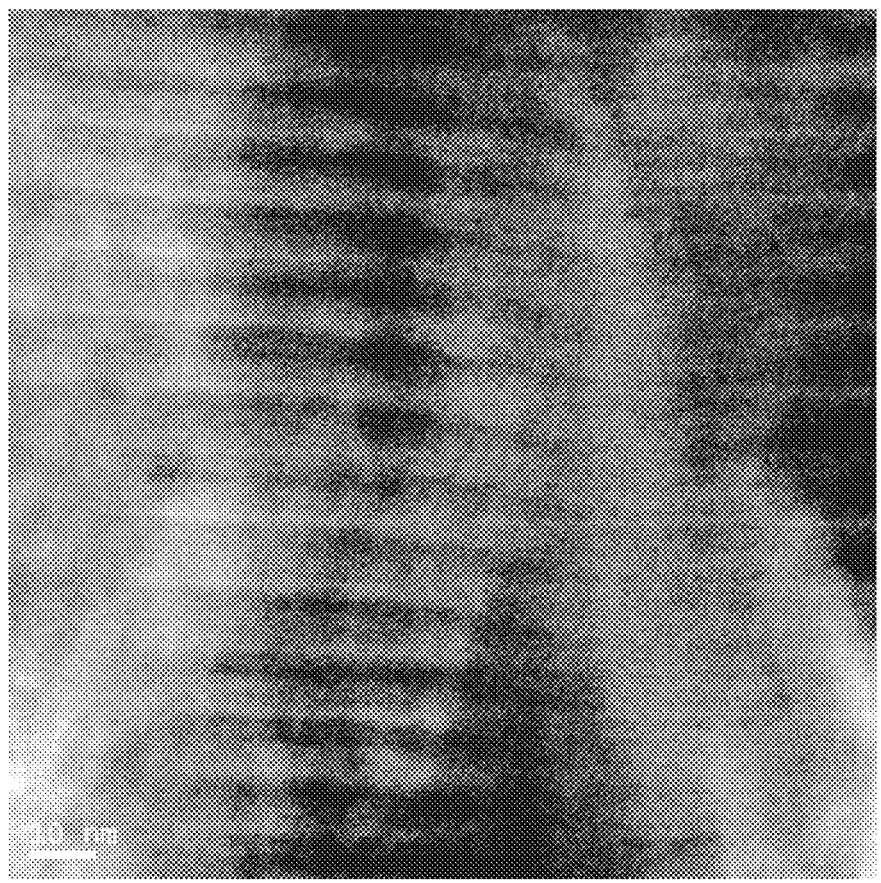
FIG. 2 is a photographic image of a cross section of a coating of a cutting tool according to a comparative example for that according to the present embodiment, as obtained through a scanning transmission electron microscope.

Furthermore, when the coating was observed with STEM in Examples 1 to 21 and Comparative Examples 1 to 9, it has been found that the multilayer structure layer formed a multilayer structure in which the layers A and B were alternately deposited (see FIGS. 1A and 2).

<Measuring Layers A and B in Thickness>

The thickness of each of the layer A and the layer B was determined through an analysis using EELS. Specifically, in an STEM image obtained by the above measurement, intensity profiles corresponding to Cr and Ti were measured in a direction parallel to a direction in which the multilayer structure layer was stacked (region 3b in FIG. 3A). For example, on the lower side of FIG. 3B is shown a result of the intensity profiles obtained by this measurement. In FIG. 3B, an intensity profile is represented as a line graph with the X axis (the horizontal axis) representing a distance from a measurement starting point on the multilayer structure layer and the Y axis (the vertical axis) representing intensity (or brightness attributed to atoms). In the obtained graph, distances between intersections of a line graph corresponding to Cr and a line graph corresponding to Ti were defined as thicknesses of the layers A and B. Herein, Cr exists only in the layer A, and accordingly, a distance along the X axis between such intersections which were located at a portion having a composition ratio of Cr higher than a composition ratio of Ti was defined as a thickness of the layer A.

Furthermore, a distance along the X axis between such intersections which were located at a portion having a composition ratio of Ti higher than a composition ratio of Cr was defined as a thickness of the layer B. The thickness of each layer A thus determined was calculated at at least four locations and an average value thereof was taken as the thickness of the layer A, and so was the thickness of each layer B. A result thereof is shown in Tables 1 to 3.

<How Many Times Layers A and B are Stacked (Or the Number of Repeating Units)>

Based on the thickness of the multilayer structure layer obtained by the above measurement and the thickness of each of the layer A and the layer B, how many times layers A and B were stacked (or the number of repeating units) was calculated from the following formula:

(Number of repeating units)=(Thickness of multilayer structure layer)/(Total thickness of layers A and B)

The obtained numbers of repeating units are shown in Tables 1 to 3.

<Domain Region and Matrix Region in Layer A (Fine Structure of Layer A)>

The domain and matrix regions in the layer A in the multilayer structure layer were identified by, for example, an analysis using LAADF-STEM: Low-Angle Annular Dark-Field Scanning Transmission Electron Microscopy. Specifically, initially, the cutting tool was cut and the cut surface was polished to prepare a cut piece of a length of 2.5 mm×a width of 0.5 mm×a thickness of 0.1 mm including the substrate and the coating. A measurement sample was obtained by processing the cut piece using an ion slicer device (trade name: "IB-09060CIS," manufactured by JEOL Ltd.) until the cut piece had a thickness of 50 nm or less. Further, a cross-sectional STEM image as shown in FIG. 1A, for example, was obtained by analyzing the measurement sample by using LAADF-STEM. This was done with a measurement magnification for example of 2 million times.

In region 1b shown in FIG. 1A, it was able to be visually confirmed that a dark region (or the matrix region) was disposed to surround each of bright regions (or the domain region). Herein, for analysis using LAADF-STEM, a STEM device (trade name: "JEM-2100F," manufactured by JEOL Ltd.) was used with an acceleration voltage of 200 kV.

Figure 1C:
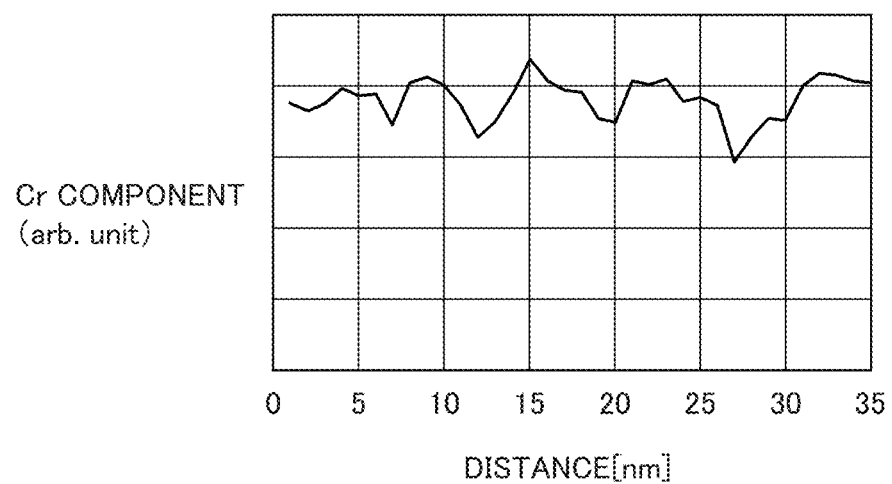
FIG. 1C is a graph representing a result of a line analysis of region 1b in FIG. 1A by the EELS method.

Subsequently, as shown in the photograph on the upper side in FIG. 1B, in a region corresponding to the layer A in the cross-sectional STEM image (i.e., region 1b in FIG. 1A), brightness attributed to the layer A's atoms and strain and the like, as observed for a width of 2 nm along the layer A in a direction parallel to an interface between the layer A and the layer B, was measured as a LAADF intensity profile. On the lower side of FIG. 1B is shown a result of the intensity profile for the width of 2 nm in the direction of the measurement. In FIG. 1B, the intensity profile is represented as a line graph with the X axis (the horizontal axis) representing a distance from a measurement starting point on the layer A and the Y axis (the vertical axis) representing intensity (or brightness attributed to atoms). As shown in the line graph of FIG. 1B, in the cutting tools of Example 1 to 21 and Comparative Examples 8 and 9, a repeated pattern of irregularities was observed in the above intensity profile in the layer A, and it has been found that the domain region and the matrix region exist (indicated as a domain-matrix structure in Tables 1-3). It was determined that a peak portion of the LAADF intensity represented the domain region and a valley portion of the LAADF intensity represented the matrix region. Furthermore, the domain region and the matrix region were able to be determined more clearly by matching the above-described cross-sectional STEM image (region 1b in FIG. 1A) against the repeated pattern of irregularities in the intensity profile. Furthermore, in the STEM image (region 1b in FIG. 1A) obtained by the measurement, an intensity profile corresponding to Cr along the layer A in a direction parallel to an interface between the layer A and the layer B was measured in the EELS method. A result thereof is shown in FIG. 1C. It was able to be determined that in the Cr intensity profile, a high region was the domain region and a relatively low region was the matrix region. In contrast, in the cutting tools of Comparative Examples 1 to 7 manufactured in a method in which the evaporation source for forming the layer A did not contain boron, no repeated pattern of irregularities was observed in the above intensity profile in the layer A. That is, in the cutting tools of Comparative Examples 1 to 7, the domain region and the matrix region did not exist in the layer A (indicated as a non-domain-matrix structure in Tables 1 to 3).

From the above results, it has been found that it is effective to include a trace amount of boron in the evaporation source for forming the layer A in order to form the domain region and the matrix region in the layer A.

<Analyzing Droplets in Layer A>

Analysis of droplets in the layer A was conducted by the following method. Initially, the cutting tool was cut, and the cut surface was polished using a focused ion beam device, a cross section polisher device, or the like. Subsequently, the polished, cut surface was subjected to a composition analysis with an EDX which a scanning electron microscope was equipped with.

As a result, it had been found that in the coatings according to Examples 1 to 21, the droplets in the layer A contained boron.

<Average Composition of Layer A and Composition of Layer B>

The layer A's average composition and the layer B's composition were calculated by the following method. Each layer's central part was subjected to a line analysis by TEM-EELS (observation magnification: 2 million times), and for the layer A a composition ratio of Al and Cr was calculated, and for the layer B a composition ratio of Al and Ti was calculated. A result thereof is shown in Tables 1 to 3.

<<Cutting Test>>

<Cutting Test 1: Milling Test>

Using the cutting tools of the samples (Examples 1 to 21 and Comparative Examples 1 to 9) produced as described above, a cutting distance reached before the flank face was worn by an amount (Vb) of 0.2 mm was measured under the cutting conditions indicated below. A result thereof is shown in table 4. A cutting tool providing a longer cutting distance can be evaluated as a cutting tool with excellent wear resistance.

Cutting Conditions
Workpiece: SCM435
Cutting speed: 350 m/min.
Feed rate: 0.2 mm/t
Cutting depth (ap): 2 mm <Cutting Test 2: Milling Test>

Using the cutting tools of the samples (Examples 1 to 21 and Comparative Examples 1 to 9) produced as described above, a cutting distance reached before the flank face was worn by an amount (Vb) of 0.2 mm was measured under the cutting conditions indicated below. A result thereof is shown in table 4. A cutting tool providing a longer cutting distance can be evaluated as a cutting tool with excellent wear resistance.

Cutting Conditions
Workpiece: FCD700
Cutting speed: 200 m/min.
Feed rate: 0.2 mm/t
Cutting depth (ap): 2 mm

TABLE 4

|  | cutting test 1: SCM435 | cutting test 2: FCD700 |
| --- | --- | --- |
| example 1 | 4.2 m | 5.4 m |
| example 2 | 4.2 m | 5.4 m |
| example 3 | 4.5 m | 6 m |
| example 4 | 4.5 m | 6 m |
| example 5 | 9.9 m | 12.9 m |
| example 6 | 9.3 m | 13.8 m |
| example 7 | 9 m | 15 m |
| example 8 | 7.8 m | 15.3 m |
| example 9 | 8.4 m | 14.1 m |
| example 10 | 9 m | 15 m |
| example 11 | 9 m | 15 m |
| example 12 | 7.2 m | 15.3 m |
| example 13 | 5.4 m | 9 m |
| example 14 | 7.2 m | 12 m |
| example 15 | 7.5 m | 12.6 m |
| example 16 | 8.1 m | 13.5 m |
| example 17 | 7.5 m | 12.6 m |
| example 18 | 5.4 m | 9 m |
| example 19 | 6.3 m | 10.5 m |
| example 20 | 5.4 m | 9 m |
| example 21 | 5.1 m | 8.1 m |
| comparative example 1 | 0.9 m | 1.2 m |
| comparative example 2 | 1.2 m | 1.8 m |
| comparative example 3 | 1.8 m | 2.4 m |
| comparative example 4 | 1.8 m | 3 m |
| comparative example 5 | 1.8 m | 3 m |
| comparative example 6 | 1.8 m | 3.3 m |
| comparative example 7 | 1.2 m | 1.8 m |
| comparative example 8 | 2.1 m | 3.6 m |
| comparative example 9 | 1.8 m | 3.6 m |

Regarding the cutting test 1, table 4 shows a result indicating that the cutting tools of Examples 1 to 21 had good results of a cutting distance of 4 m or more. On the other hand, the cutting tools of Comparative Examples 1 to 9 had a cutting distance of less than 4 m. It is inferred that the cutting conditions for the cutting test 1 provide high cutting resistance, and it is believed that the cutting tools of Examples 1 to 21 provide larger strength at high temperature and larger resistance to development of thermal cracking than the cutting tools of Comparative Examples 1 to 9. That is, it has been found that the cutting tools of Examples 1 to 21 are excellent in wear resistance and in addition thereto breaking resistance and resistance to development of thermal cracking.

Regarding the cutting test 2, table 4 shows a result indicating that the cutting tools of Examples 1 to 21 had good results of a cutting distance of 5 m or more. On the other hand, the cutting tools of Comparative Examples 1 to 9 had a cutting distance of less than 5 m. From a result of Test 2, it has been found that the cutting tools of Examples 1 to 21 are superior in wear resistance to and also have longer tool life than the cutting tools of Comparative Examples 1 to 9.

Thus while embodiments and examples of the present invention have been described, it is also initially planned to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST

1 rake face, 2 flank face, 3 cutting edge ridge portion, 10 cutting tool, 11 substrate, 12 multilayer structure layer, 20 coating, 31 domain region, 32 matrix region, 121 layer A, 122 layer B.

The invention claimed is:

1. A cutting tool comprising a substrate and a coating that coats a surface of the substrate,
    the coating including a multilayer structure layer composed of at least one layer A and at least one layer B alternately deposited from a side closer to the substrate toward a side closer to a surface,
    the layer A having an average composition of $Al_xCr_{(1-x)}N$,
    the layer B being composed of $Al_yTi_{(1-y)}N$,
    the layer A being composed of a domain region and a matrix region,
    the domain region being a region present as a plurality of portions dispersed in the matrix region along the layer A in a direction parallel to an interface of the layer A and the layer B,
    the matrix region being a region disposed to surround each of the plurality of portions constituting the domain region,
    the domain region having a composition ratio of Cr larger than that of Cr of the matrix region,
    wherein x has a range of $0.5 \leq x \leq 0.8$ and y has a range of $0.5 \leq y \leq 0.7$.

2. The cutting tool according to claim 1, wherein the layer A has a thickness of 0.2 nm or more and 3 μm or less.

3. The cutting tool according to claim 1, wherein the layer B has a thickness of 0.2 nm or more and 3 μm or less.

4. The cutting tool according to claim 1, wherein the multilayer structure layer has a thickness of 0.5 μm or more and 30 μm or less.

* * * * *